(12) United States Patent
Kudo et al.

(10) Patent No.: US 10,276,415 B2
(45) Date of Patent: Apr. 30, 2019

(54) GAS PURGE UNIT

(71) Applicant: TDK CORPORATION, Minato-ku, Tokyo (JP)

(72) Inventors: Takuya Kudo, Tokyo (JP); Toshihiko Miyajima, Tokyo (JP)

(73) Assignee: TDK CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/087,689

(22) Filed: Mar. 31, 2016

(65) Prior Publication Data

US 2017/0025297 A1 Jan. 26, 2017

(30) Foreign Application Priority Data

Mar. 31, 2015 (JP) ................. 2015-071623

(51) Int. Cl.
| | | |
|---|---|---|
| *H01L 21/673* | (2006.01) | |
| *B08B 9/093* | (2006.01) | |
| *H01L 21/67* | (2006.01) | |
| *B08B 5/02* | (2006.01) | |
| *B05B 1/00* | (2006.01) | |
| *B05B 1/34* | (2006.01) | |
| *H01L 21/677* | (2006.01) | |
| *B08B 9/00* | (2006.01) | |

(52) U.S. Cl.
CPC .. *H01L 21/67389* (2013.01); *H01L 21/67772* (2013.01); *B08B 9/00* (2013.01); *H01L 21/67775* (2013.01)

(58) Field of Classification Search
CPC ......... H01L 21/67389; H01L 21/67772; H01L 21/6775; B05B 1/005; B05B 1/34; B08B 9/00

See application file for complete search history.

(56) References Cited

U.S. PATENT DOCUMENTS

| | | | | |
|---|---|---|---|---|
| 7,726,353 | B2 * | 6/2010 | Okabe | H01L 21/67017 141/51 |
| 7,789,609 | B2 * | 9/2010 | Okabe | H01L 21/67772 141/51 |
| 2004/0152322 | A1 | 8/2004 | Tokunaga | |
| 2007/0151620 | A1 * | 7/2007 | Okabe | H01L 21/67017 141/63 |
| 2009/0035100 | A1 * | 2/2009 | Okabe | H01L 21/67772 414/217 |

(Continued)

FOREIGN PATENT DOCUMENTS

| | | |
|---|---|---|
| EP | 1 075 023 A1 | 2/2001 |
| JP | H11-307623 A | 11/1999 |

(Continued)

*Primary Examiner* — Dung Van Nguyen
(74) *Attorney, Agent, or Firm* — Arent Fox LLP

(57) ABSTRACT

A gas purge unit introduces a cleaning gas into a container with a main opening there through for taking a housed object in and out. The gas purge unit includes a blowout member and a supply portion. The blowout member with a cylindrical shape has an elongated hollow extending in a longitudinal direction and a discharge portion of a porous body connecting between the elongated hollow and the outside to discharge the cleaning gas. The supply portion is connected to the elongated hollow through a connection hole formed at one end of the blowout member to supply the cleaning gas to the elongated hollow.

1 Claim, 11 Drawing Sheets

(56) References Cited

U.S. PATENT DOCUMENTS

| | | | | |
|---|---|---|---|---|
| 2009/0092468 | A1* | 4/2009 | Oyama | H01L 21/67017 |
| | | | | 414/222.01 |
| 2012/0160267 | A1* | 6/2012 | Kodera | B08B 1/04 |
| | | | | 134/6 |
| 2013/0042945 | A1* | 2/2013 | Emoto | H01L 21/67017 |
| | | | | 141/98 |
| 2015/0040950 | A1* | 2/2015 | Kaise | H01L 21/67034 |
| | | | | 134/22.18 |

FOREIGN PATENT DOCUMENTS

| | | |
|---|---|---|
| JP | 2004-22674 A | 1/2004 |
| JP | 2004-235516 A | 8/2004 |
| JP | 2011-61156 A | 3/2011 |

\* cited by examiner

GAS PURGE UNIT

BACKGROUND OF THE INVENTION

1. Field of the Invention

The present invention relates to a gas purge unit used for a manufacturing process of semiconductors, for example.

2. Description of the Related Art

In the manufacturing process of semiconductors, wafers housed in a wafer transfer container, called such as FOUP and pod, include one where high-density metal wirings or so are formed, for example. It may become impossible to obtain desired characteristics at the time of completion of elements simply because the wafer surface where such high-density metal wirings are formed is slightly oxidized during the process. To prevent foreign material deposition on the wafer surface and oxidation thereof during the process, the transport container is thus necessary to maintain its cleanliness at a high level while controlling oxygen concentration inside of the container.

However, when the wafers in the transport container are brought to various processing apparatuses for performing predetermined processes thereto, a main opening of the container needs to be open for taking the wafers in and out from the container. At this time, the inside of the container is connected through the main opening to the environment in an intermediate chamber with a robot arm that transports the wafers from the container to the various processing apparatuses. The environment in the intermediate chamber is controlled by an apparatus (e.g. EFEM) with fan and filter for purifying the environment in the intermediate chamber to maintain a cleanliness in the chamber at a predetermined value or higher. However, the intermediate chamber may have a cleanliness lower than that in a transport container filled with a cleaning gas, such as nitrogen gas. Thus, when the air in the intermediate chamber intrudes into the transport container, oxygen concentration in the container is increased, and the wafer surface is more likely oxidized.

For example, Patent Document 1 suggests a technique for introducing a purge gas, such as nitrogen gas, into a transport container.

Patent Document 1: Japanese Patent Laid-Open No. 2004-235516

SUMMARY OF THE INVENTION

In the conventional apparatuses, however, particles adhered on rear surface of the wafer are dispersed due to impulse of the purge gas introduced into the transport container. This causes the particles dispersed by the purge gas to adhere on high-density wiring areas where particle adhesion should be most avoided. Thus, the conventional apparatuses cannot sufficiently decrease a rate of defective goods at the time of completion of elements in spite of introduction of the purge gas.

The present invention has been achieved in consideration of the circumstances. Its object is to provide a gas purge unit capable of preventing particle scattering at the time of introduction of a purge gas.

To achieve the above object, the gas purge unit according to the present invention is for introducing a cleaning gas into a container with a main opening therethrough for taking a housed object in and out, and comprises:

a blowout member with a cylindrical shape comprising an elongated hollow extending in a longitudinal direction and a discharge portion of a porous body connecting between the elongated hollow and the outside to discharge the cleaning gas; and a supply portion connected to the elongated hollow through a connection hole formed at one end of the blowout member to supply the cleaning gas to the elongated hollow.

The gas purge unit according to the present embodiment discharges the gas to the outside through the discharge portion of the porous body. This can weaken speed and directivity of the discharged cleaning gas. Thus, a space where the speed of the cleaning gas is locally increased is hardly formed in the container, and the cleaning gas can be introduced into the transport container while preventing particle scattering.

Also, for example, the gas purge unit according to the present invention may comprise a shielding portion extending in the longitudinal direction of the blowout member and arranged at a part of radial directions perpendicular to the longitudinal direction to shield a cleaning gas flow from the blowout member toward the part of the radial directions.

Due to the operation of the shielding portion, the cleaning gas can be more efficiently introduced into the container, and a cleanliness in the container can be enhanced.

Also, for example, the porous body composing the discharge portion may have a cylindrical outer shape, and the elongated hollow may be formed inside of the cylindrical discharge portion.

The porous body composing the discharge portion is cylindrical, and the cleaning gas is discharged from the entire cylindrical discharge portion. This can reduce dispersion of a discharge amount at every part of the discharge portion. This allows the gas purge unit with the discharge portion to efficiently introduce the cleaning gas into the entire container.

Also, for example, the discharge portion may be made of a porous body of inorganic material.

The porous body composing the discharge portion may be non-organic or organic material. When the discharge portion is made of the porous body of non-organic material, the housed object can be prevented from being adversely affected by mixture of organics in the cleaning gas.

DESCRIPTION OF THE PREFERRED EMBODIMENTS

Figure 1:
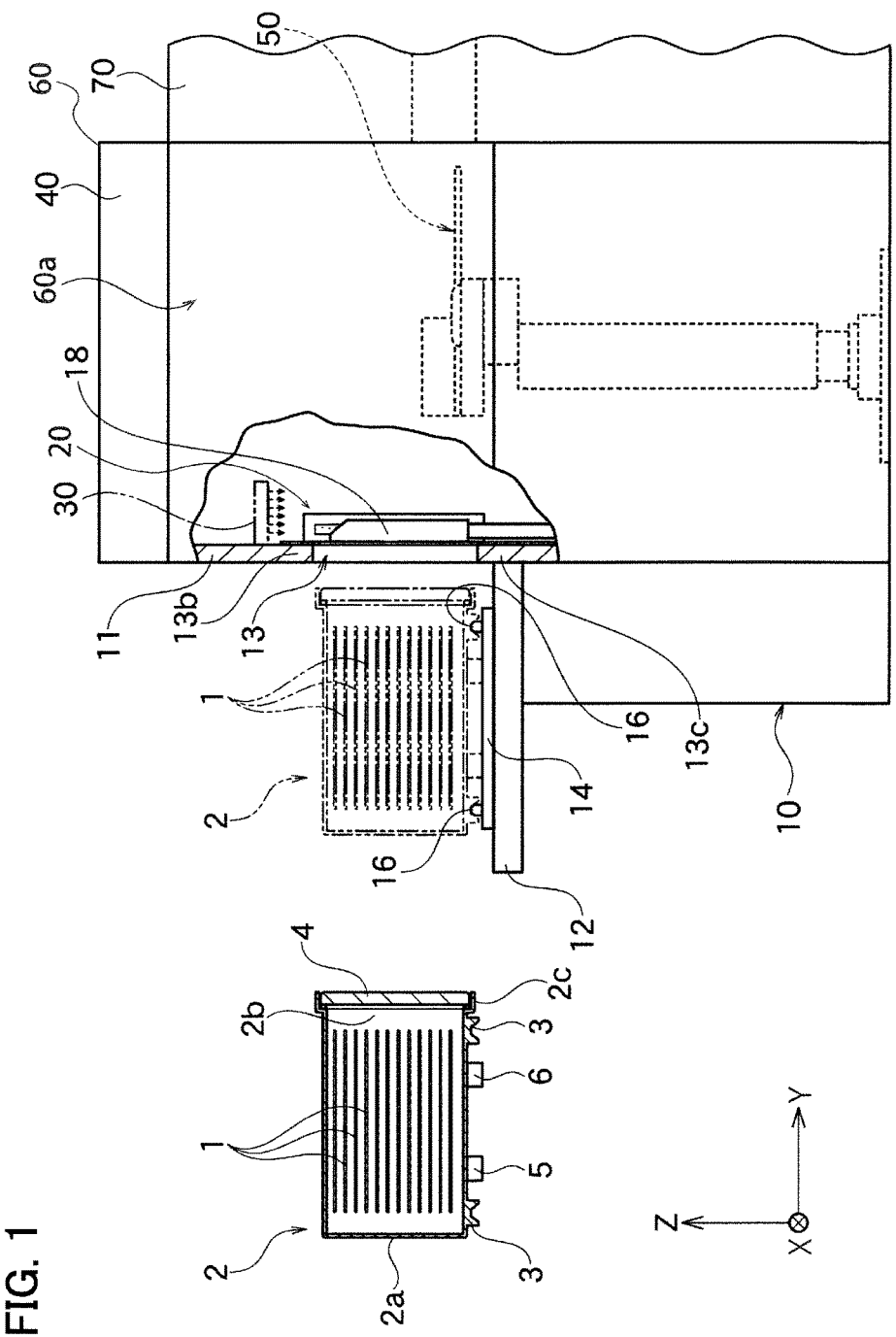
FIG. 1 is a partial cross-sectional schematic view of a load port apparatus to which a gas purge unit according to one embodiment of the present invention is applied.

Hereinafter, the present invention will be explained with reference to an embodiment shown in the drawings.

FIG. 1 is a partial cross-sectional schematic view of a load port apparatus 10 having gas purge units 20 according to one embodiment of the present invention. The load port apparatus 10 shown in FIG. 1 is connected to an intermediate chamber 60a of an EFEM body 60. In the embodiment mentioned below, the present invention will be explained with reference to the gas purge units 20 applied to the load port apparatus 10, but usage of the gas purge units 20 is not limited to the embodiment, and the gas purge units 20 can be applied to other apparatuses introducing a cleaning gas from a main opening for taking a housed object in and out.

The load port apparatus 10 is an interface apparatus for transporting wafers 1 housed in a sealed state in a sealed transport container 2 into the intermediate chamber 60a while maintaining a clean condition. One or plural processing chambers 70 are connected airtightly to the intermediate chamber 60a, and the wafers 1 transported into the intermediate chamber 60a are further transported from the intermediate chamber 60a into the processing chamber 70. The processing chamber 70 is part of an apparatus for performing predetermined processes against the wafers 1. In the processing chamber 70a, the predetermined processes are sequentially performed against the wafers 1 transported by a robot arm 50. Any apparatus used in semiconductor manufacturing process, such as vapor apparatus, sputtering apparatus, and etching apparatus, is used for the apparatus including the processing chamber 70.

The load port apparatus 10 has a wall 11, an installation stand 12, a movable table 14, a door 18, a gas purge unit 20, and the like. The movable table 14 is arranged on the installation stand 12 and movable in the Y-axis direction on the installation stand 12. Note that, in the figures, the Y-axis represents a moving direction of the movable table 14, the Z-axis represents a vertical direction, and the X-axis represents a direction vertical to the Y-axis and the Z-axis.

The sealed transport container 2 can be detachably placed on a top of the movable table 14 in the Z-axis direction. The sealed transport container 2 consists of a pot or a FOUP etc. for transporting a plurality of the wafers 1 while they are sealed and stored. The other components of the load port apparatus 10 will be mentioned below.

The container 2 has a casing 2a, a lid 4, an intake port 5, an exhaust port 6, and the like. A space for housing the wafers 1 to be processed is formed inside of the casing 2a. The casing 2a has an approximately box-like shape with a main opening 2b on one of its surfaces in the horizontal direction. The main opening 2b is for taking the wafers 1 of housed objects in and out. The lid 4 can seal the main opening 2b of the casing 2a. As mentioned below, the load port apparatus 10 moves the lid 4 to open and close the main opening 2b.

A shelf (not illustrated) is arranged in the casing 2a. This shelf has multiple stages for housing the multiple wafers 1 by overlapping them without any contact with each other. The wafers 1 housed in the container 2 are placed on each stage of the shelf one by one to be held horizontally and arranged in the casing 2a with predetermined intervals along the vertical direction (Z-axis direction).

The robot arm 50 is arranged in the intermediate chamber 60a of the EFEM body 60. A fan filter unit (FFU) 40 is mounted on the top of the intermediate chamber 60a. The EFEM body 60 flows a clean air by downflow from the FFU 40 into the intermediate chamber 60a to create a local clean environment therein. The internal cleanliness of the intermediate chamber 60a is lower than that of the container 2, but is higher than the cleanliness of the external environment.

The wall 11 of the load port apparatus 10 is opposed to the container 2 placed on the table 14, and is configured to function as part of the casing for sealing the intermediate chamber 60a. A wall-side opening 13 is formed in the wall 11. The door 18 opens and closes the wall-side opening 13.

Figure 3A:
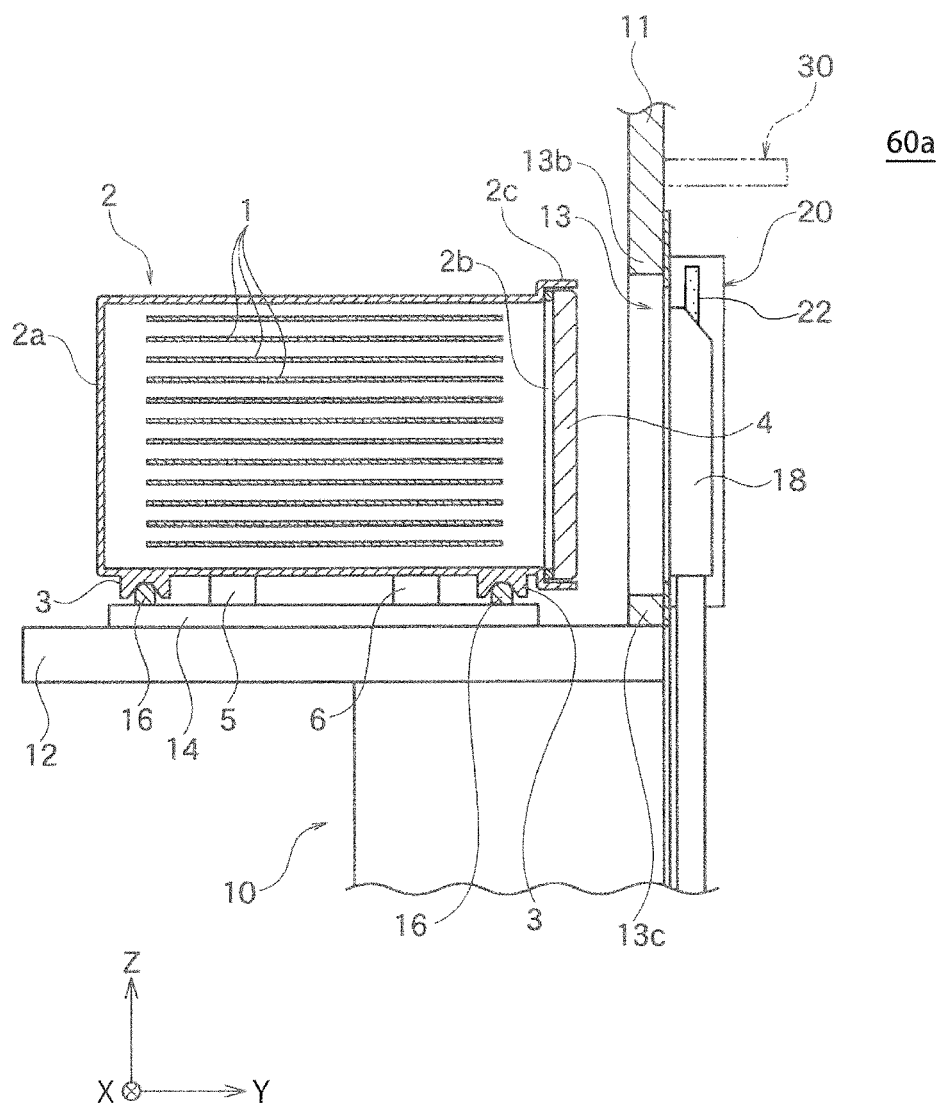
FIG. 3A is a schematic view showing a step where a lid of a FOUP is opened by a load port apparatus.

The movement of the door 18 will be briefly explained with reference to FIG. 3A to FIG. 3D. When the container 2 is mounted on the table 14, as shown in FIG. 3A, positioning pins 16 are engaged with concaves of positioning portions 3 arranged on a bottom surface of the casing 2a of the container 2. This nonambiguously determines a positional relation between the container 2 and the table 14. During storage of the wafers 1 and transportation of the container 2 itself housing the wafers 1, the container 2 is internally sealed, and the environment around the wafers 1 is maintained in a substantially constant state.

Figure 3B:
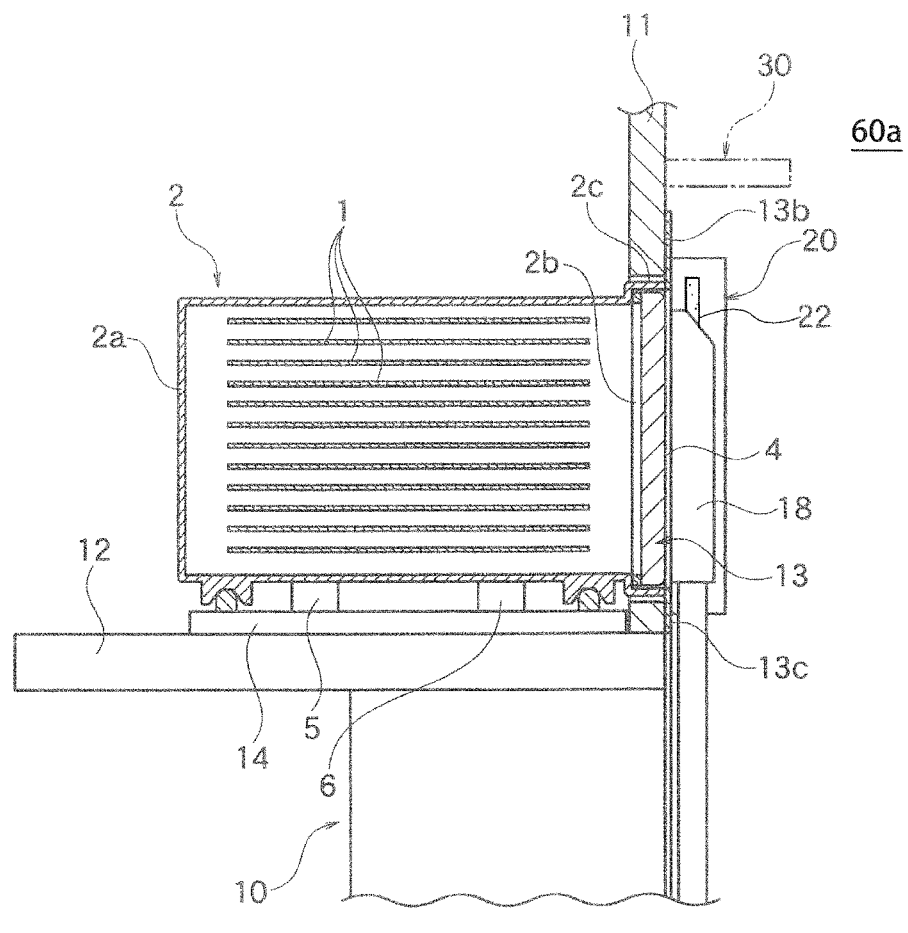
FIG. 3B is a schematic view showing a step following FIG. 3A.

When the container 2 is positioned and placed on the top surface of the table 14, the intake port 5 and the exhaust port 6, both of which are formed on the bottom surface of the container 2, are respectively airtightly connected to a bottom purge apparatus placed inside of the table 14. Then, a bottom gas purge is performed through the intake port 5 and the exhaust port 6, both of which are attached on the lower portion of the container 2. As shown in FIG. 3B, under a condition that the bottom gas purge is being performed, the table 14 moves in the Y-axis direction, and opening edges 2c attached with the lid 4 airtightly sealing the opening 2b of the container 2 enter the wall-side opening 13 of the wall 11.

Figure 3C:
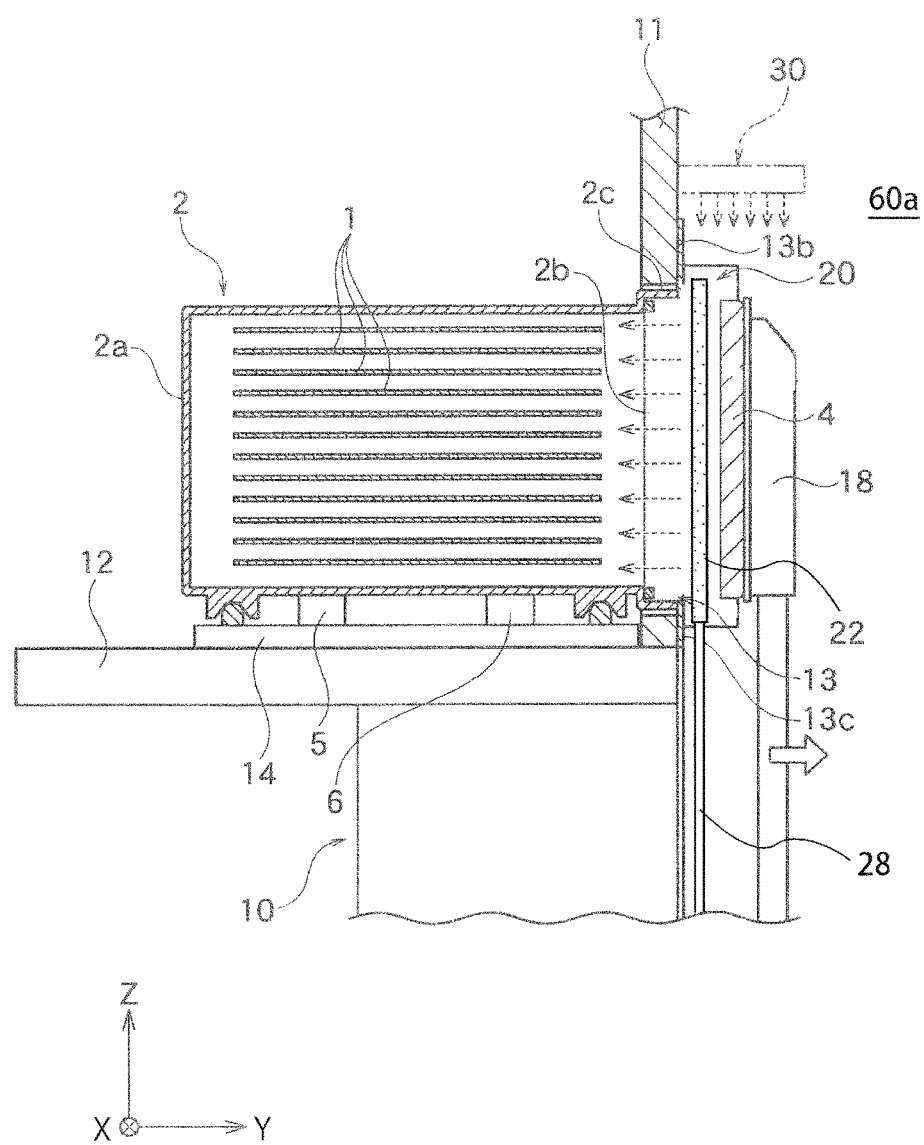
FIG. 3C is a schematic view showing a step following FIG. 3B.

At the same time, the lid 4 of the container 2 is engaged with the surface of the door 18 opposing the container 2 and sealing the wall-side opening 13. At this time, a space between the opening edges 2c and opening edges of the wall-side opening 13 is sealed by gasket or so, and the space is sealed in a good condition. Thereafter, as shown in FIG. 3C, the door 18 is moved with the lid 4 in parallel in the Y-axis direction or moved rotationally to move the lid 4 into the intermediate chamber 60a and detach it from the opening edges 2c. In this way, the main opening 2b of the container 2 is opened to internally connect between the container 2 and the intermediate chamber 60a through the main opening 2b and the wall-side opening 13.

The bottom purge may be continuously operated after the main opening 2b is opened. Further, in addition to the bottom purge or after stopping the bottom purge, a front purge is started to introduce a purge gas (cleaning gas), such as nitrogen gas and other inert gas, from the opened main opening 2b into the container 2. The front purge is performed by discharging a cleaning gas from discharging portions 24 of blowout members 22 attached to the gas purge units 20 into the container 2 using the gas purge units 20 arranged on the wall 11. The gas purge units 20 will be mentioned below.

Figure 3D:
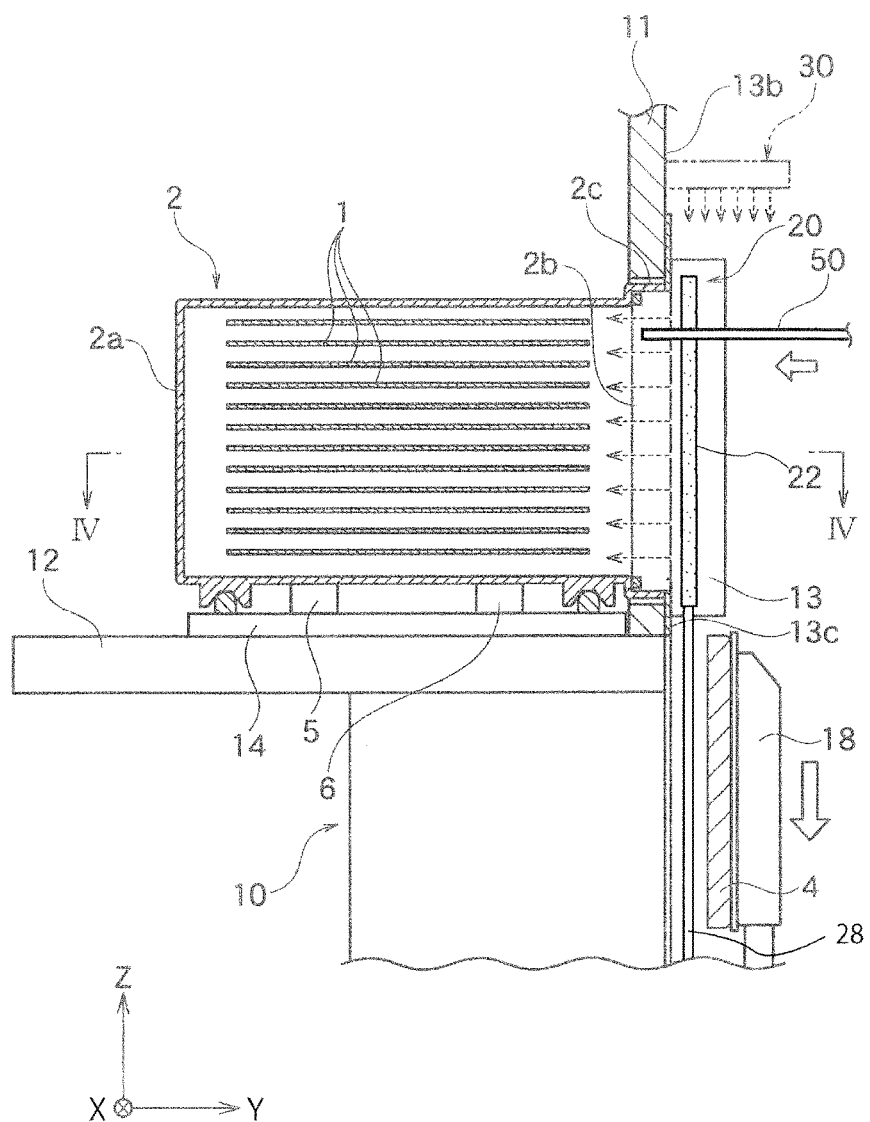
FIG. 3D is a schematic view showing a step following FIG. 3C.

Next, as shown in FIG. 3D, the lid 4 moved to the intermediate chamber 60a with the door 18 is moved downward in the Z-axis to completely open the main opening 2b of the container 2 against the intermediate chamber 60a. This allows the robot arm 50 arranged in the intermediate chamber 60a to pick up the wafers 1 in the container 2 and transport the wafers 1 to the intermediate chamber 60a through the main opening 2b and the wall-side opening 13. During transport operation of the wafers 1 by the robot arm 50, the front purge is preferably constantly continued while the main opening 2b is opened. This prevents the air in the intermediate chamber 60a from flowing into the container 2 and maintains a clean environment in the container 2 compared with the intermediate chamber 60a. Operations opposite to the above may be performed to close the main opening 2b of the container 2 and detach the container 2 from the table 14.

Note that, the intake port 5, the exhaust port 6, the gas purge units 20, and the like are enlarged in the figures for easy understanding compared with the sealed transport container 2, but are different from actual dimension ratio.

Next, the gas purge units 20 for performing the front purge according to the present embodiment will be explained with reference to the figures.

Figure 2:
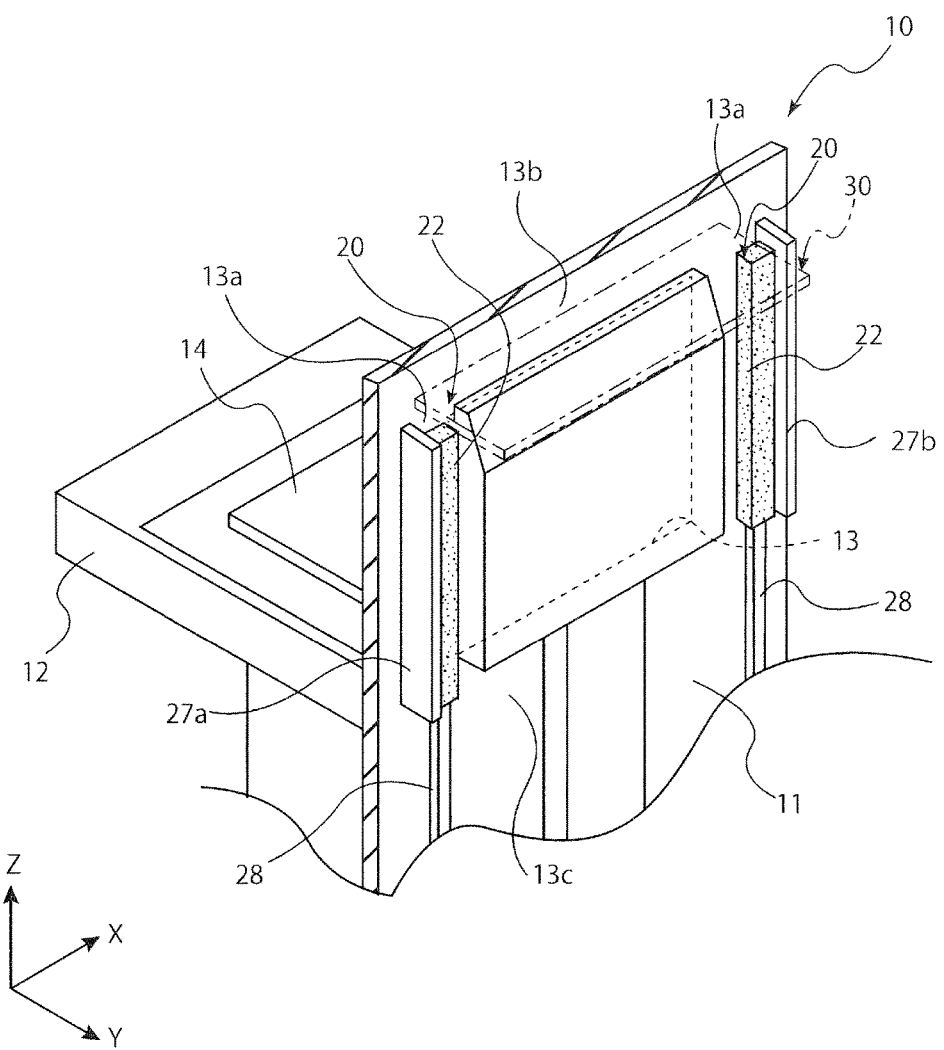
FIG. 2 is a partial cross-sectional perspective view of the load port apparatus shown in FIG. 1.

As shown in FIG. 2, in the load port apparatus 10 according to the present embodiment, the wall-side opening 13 formed on the wall 11 has a rectangular opening surface and is enclosed by an upper side line part 13b, a lower side line part 13c, and two lateral side line parts 13a of the wall 11. As shown in FIG. 3A, the main opening 2b of the container 2 has a shape corresponding to the wall-side opening 13 and is configured to have the same size as the wall-side opening 13 or a little smaller size than the wall-side opening 13.

As shown in FIG. 2, in the present embodiment, the gas purge units 20 are respectively arranged on the lateral side line parts 13a of the wall-side opening 13 to avoid the door 18. The gas purge units 20 are arranged to be adjacent to the inner surface of the wall 11 opposite to the installation stand 12, and cleaning gases from the gas purge units 20 are introduced from the main opening 2b of the container 2 into the container 2 while the door 18 and the lid 4 are opened (see FIG. 3C and FIG. 3D). The gas purge units 20 are fixed by any method, such as a method for directly fixing the gas purge units 20 on the inner surface of the wall 11, a method for fixing the gas purge units 20 on the wall 11 through shielding portions 27a and 27b, and a method for fixing the gas purge units 20 on the wall 11 by fixing supply portions 28 extending downward (Z-axis negative direction) to other member.

Figure 4:
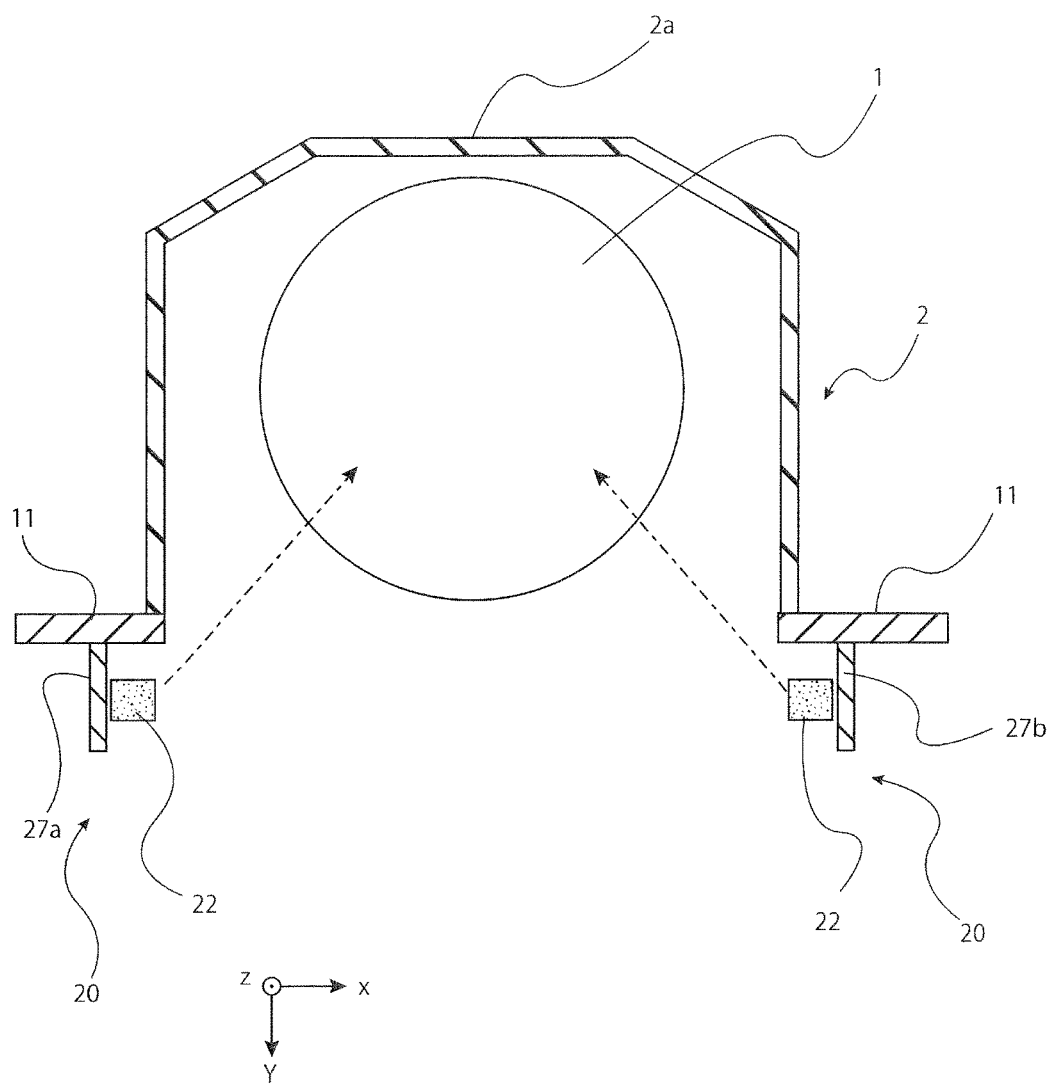
FIG. 4 is a cross-sectional view taken along line IV-IV shown in FIG. 3D.

As shown in FIG. 2 and FIG. 4, the gas purge units 20 are respectively arranged along the Z-axis direction on the lateral side line parts 13a of the wall-side opening 13. Also, as shown in FIG. 3D, the gas purge units 20 are configured to have a length in the Z-axis direction that is longer than that of the main opening 2b of the container 2. As shown in FIG. 2 and FIG. 4, the gas purge units 20 respectively have the cylindrical blowout members 22.

Figure 5A:
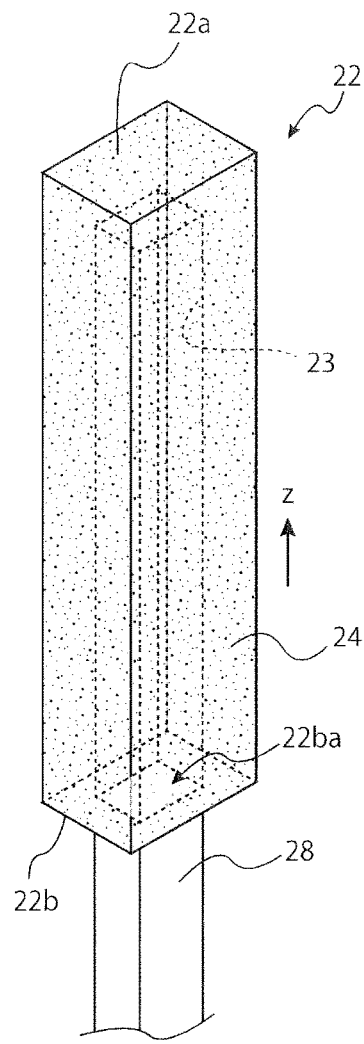
FIG. 5A is a schematic perspective view of the gas purge unit shown in FIG. 1 and FIG. 4 etc.
Figure 5B:
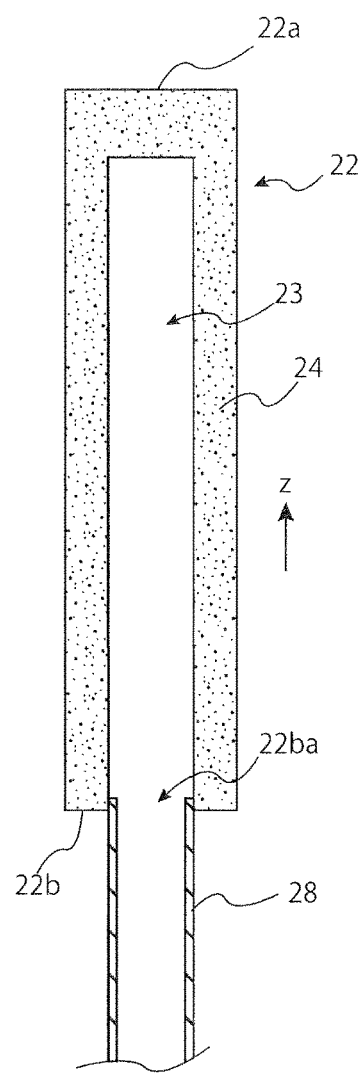
FIG. 5B is a vertical cross section thereof.

In this embodiment, the blowout members 22 have a rectangular and cylindrical outer shape that is narrow and long in the Z-axis direction. The longitudinal direction of the blowout members 22 corresponds to the Z-axis direction. FIG. 5A and FIG. 5B are respectively a schematic perspective view and a schematic vertical cross section of the blowout member 22 and the supply portion 28 contained in the gas purge units 20. As shown in FIG. 5A, the blowout member 22 has a substantially rectangular and cylindrical outer shape with four side surfaces extending in the longitudinal direction and two end surfaces extending in a direction perpendicular to the longitudinal direction.

As shown in FIG. 5B, the blowout member 22 has an elongated hollow 23 extending in the longitudinal direction (Z-axis direction) and the discharge portion 24 connecting between the elongated hollow 23 and the outside. The discharge portion 24 composes a peripheral wall of the elongated hollow 23 but is made of a porous body, and thus a cleaning gas can pass through the discharge portion 24 of the peripheral wall. The cleaning gas supplied to the elongated hollow 23 is discharged to the outside through the discharge portion 24. In the blowout member 22 according to the present embodiment, the porous body composing the discharge portion 24 has a rectangular and cylindrical outer shape, and the elongated hollow 23 of a rectangular parallelepiped space is formed inside of the rectangular and cylindrical discharge portion 24.

A connection hole 22ba connected to the elongated hollow 23 is formed at a base end 22b. The base end 22b is one of ends of the blowout member 22. The supply portion 28 is connected to the elongated hollow 23 through the connection hole 22ba. The supply portion 28 supplies a cleaning gas from a gas supply tank not illustrated to the elongated hollow 23. Note that, a porous wall composing the discharge portion 24 is positioned at a tip 22a. The tip 22a is the other end of the blowout member 22.

The blowout member 22 and the discharge portion 24 are not limited to have the rectangular and cylindrical outer shape, and may have any other shape, such as polygonal and cylindrical shape and elliptical and cylindrical shape. Also, the elongated hollow 23 is not limited to have the parallelepiped shape, and may have any other shape, such as polygonal and columnar shape and elliptical and columnar shape. The blowout member 22 is not limited to the embodiment where the elongated hollow 23 is entirely covered with the discharge portion 24 of the porous body, and may be an embodiment where a discharge portion of a porous body is arranged on slits or holes formed on a non-porous cylindrical container that does not pass through a cleaning gas, for example.

The discharge portion 24 is made of any porous body, such as a porous body of organic material like resin and a porous body of non-organic material like ceramic or metal material. In particular, the discharge portion 24 is preferably made of a porous body of non-organic material. This can prevent the wafers 1 from being adversely affected by mixture of organics in the cleaning gas.

The porous material composing the discharge portion 24 has any porosity, such as 45% to 50%, which is preferred from a viewpoint of efficiently discharging a cleaning gas while weakening speed and directivity of the discharged cleaning gas. The discharge portion 24 has any average thickness (an average thickness of the wall of the elongated hollow 23), but preferably has an average thickness of 1.5 mm to 2.5 mm from the same viewpoint. The discharge portion 24 is manufactured by any method. For example, the discharge portion 24 can be manufactured by forming a stainless in a predetermined shape and sintering it.

As shown in FIG. 2 and FIG. 4, the gas purge unit 20 positioned at the X-axis negative direction side against the door 18 and the main opening 2b has the shielding portion 27a arranged at the X-axis negative direction side. The shielding portion 27a is part of a radial direction perpendicular to the longitudinal direction of the blowout member 22. As shown in FIG. 4, the shielding portion 27a is arranged to extend in the longitudinal direction of the blowout member 22 and shield a cleaning gas flow toward the X-axis negative direction side opposite to the door 18 and the main opening 2b. Likewise, the gas purge unit 20 positioned at the X-axis positive direction side against the door 18 and the main opening 2b has the shielding portion 27b. The shielding portion 27b is arranged at the X-axis positive direction side of the blowout member 22 and shields a cleaning gas flow from the blowout member 22 toward the X-axis positive direction side. The shielding portions 27a and 27b are attached on the inner surface of the wall 11 of the load port apparatus 10.

The gas purge units 20 having the shielding portions 27a and 27b can efficiently introduce cleaning gases discharged from the blowout members 22 into the container 2. This can enhance a cleanliness in the container 2.

As described above, the gas purge unit 20 according to the present embodiment discharges a cleaning gas to the outside through the discharge portion 24 of the porous body. This can weaken speed and directivity of the discharged cleaning gas. Thus, a space where the speed of the cleaning gas is locally increased is hardly formed in the container 2, and the cleaning gas can be introduced into the transport container while preventing particle scattering. Also, when using a blowout member where slits or nozzles are formed on a non-porous container that does not pass through a cleaning gas, there is a tendency that slits or nozzles near a tip of the blowout member have a large discharge amount of gas, and that slits or nozzles near a base portion have a small discharge amount of gas. On the other hand, compared with a blowout member discharging gas from ordinary nozzles or slits, the blowout member 22 having the discharge portion 24 of the porous body can decrease a difference between a discharge mount near the tip 22a and a discharge amount near the base portion 22b. Thus, the gas purge unit 20 can reduce concentration dispersion of a cleaning gas along the Z-axis direction in the container 2.

As shown in FIG. 5A and FIG. 5B, the blowout member 22 has the elongated hollow 23 formed inside of the cylindrical discharge portion 24 of the porous body, and is thus easy to be manufactured due to its simple structure.

In the front purge of the load port apparatus 10 according to the embodiment, as shown in FIG. 1, FIG. 3C, and FIG. 3D, a cleaning gas may be blown out from a curtain nozzle 30 arranged at the upper side line part 13b toward a vertical downward direction (Z-axis negative direction) in addition to the above-mentioned gas purge units 20. In the front purge, a cleaning gas downflow formed on the front surface of the main opening 2b by using the curtain nozzle 30 can more effectively prevent the air in the intermediate chamber 60a from entering the container 2.

Figure 6:
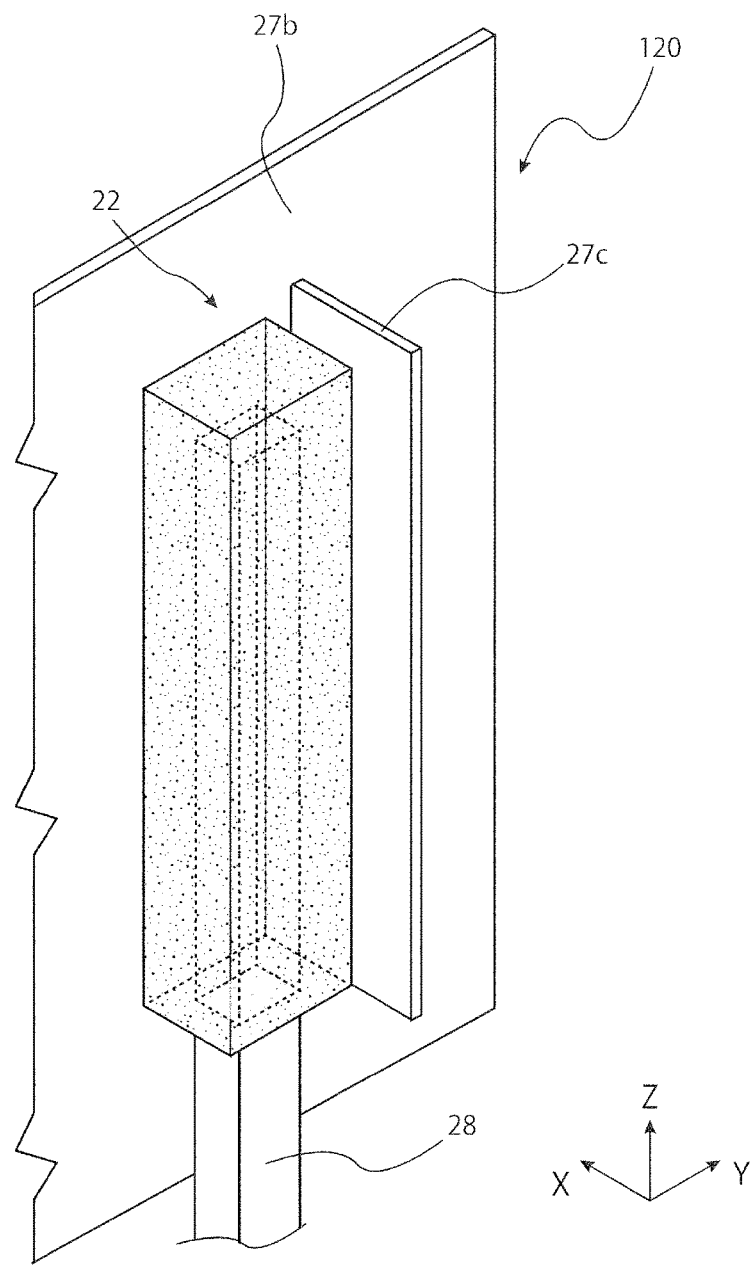
FIG. 6 is a schematic perspective view of a gas purge unit according to the first variation.

The prevent invention is not limited to the above-mentioned embodiment, and can be variously changed within the scope thereof. For example, FIG. 6 is a schematic perspective view showing a gas purge unit 120 according to the first variation. The gas purge unit 120 has a shielding portion 27c in addition to a blowout member 22, a supply portion 28, and a shielding portion 27b, all of which are the same as those of the gas purge unit 20 at the X-axis positive direction side shown in FIG. 2. The shielding portion 27c extends in the longitudinal direction of the gas purge unit 120 to shield a cleaning gas flow from the blowout member 22 toward the Y-axis positive direction side. The shielding portion 27c is attached to the shielding portion 27b. In the gas purge unit 120, the shielding portion 27b and the shielding portion 27c shield cleaning gas flows toward the X-axis positive direction side and the Y-axis positive direction side opposite to the door 18 and the main opening 2b against the blowout member 22. This can efficiently introduce cleaning gas into the container 2.

Figure 7:
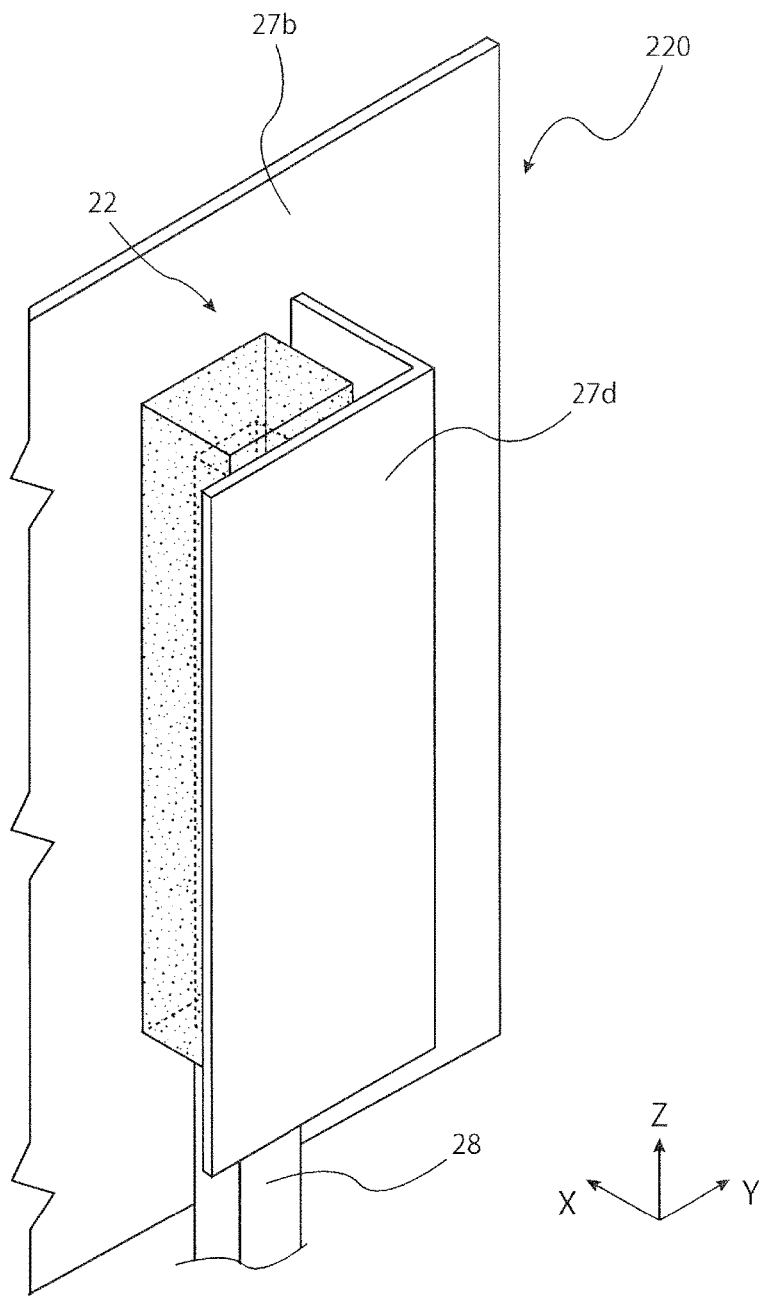
FIG. 7 is a schematic perspective view of a gas purge unit according to the second variation.

FIG. 7 is a schematic perspective view showing a gas purge unit 220 according to the second variation. The gas purge unit 220 has a shielding portion 27d in addition to a blowout member 22, a supply portion 28, and a shielding portion 27b, all of which are the same as those of the gas purge unit 20 at the X-axis positive direction side shown in FIG. 2. The shielding portion 27d extends in the longitudinal direction of the gas purge unit 220 to shield a cleaning gas flow from the blowout member 22 toward the Y-axis positive direction side and the X-axis negative direction side. The gas purge unit 220 having the shielding portion 27b and the shielding portion 27d allows a cleaning gas to flow toward the wafers 1 in the container 2. Thus, oxidation of the wafers 1 can be effectively prevented.

Figure 8:
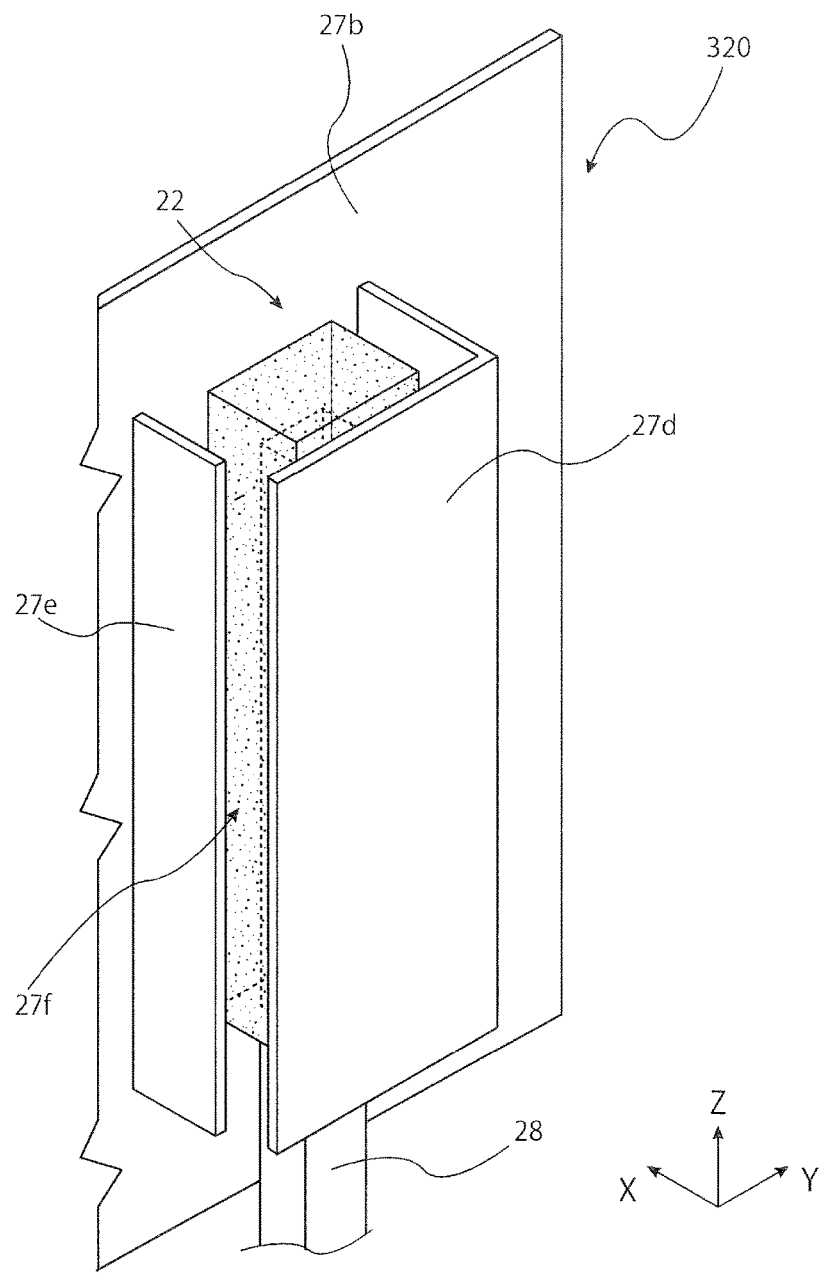
FIG. 8 is a schematic perspective view of a gas purge unit according to the third variation.

FIG. 8 is a schematic perspective view of a gas purge unit 320 according to the third variation. The gas purge unit 320 has a shielding portion 27e in addition to a blowout member 22, a supply portion 28, and shielding portions 27b and 27d, all of which are the same as those of the gas purge unit 20 shown in FIG. 7. The shielding portion 27e extends in the longitudinal direction of the gas purge unit 320 to shield a cleaning gas flow from the blowout member 22 toward the Y-axis negative direction side. However, a gap 27f is formed between the shielding portion 27e positioned at the Y-axis negative direction side of the blowout member 22 and the shielding portion 27d positioned at the X-axis negative direction side of the blowout member 22. Thus, a cleaning gas discharged from the blowout member 22 is introduced to the main opening 2b of the container 2 through the gap 27f. The gas purge unit 320 also allows a cleaning gas to flow toward the wafers 1 in the same way as the gas purge unit 220 shown in FIG. 7. Thus, oxidation of the wafers 1 can be effectively prevented.

Note that, in the above-mentioned embodiment and variations, the shielding portions 27a to 27e consist of a flat plate member or a L-shaped member seen from the Z-axis direction, but are not limited thereto and may consist of a curved plate, for example. Also, the shielding portions 27a to 27e are attached by any method, and may be directly attached to the blowout member 22. The shielding portion may be any embodiment where it is arranged from the blowout member 22 toward part of a radial direction perpendicular to the longitudinal direction, and may be a metal film or a resin layer formed on a surface of a porous material composing the discharge portion 24 of the blowout member 22.

NUMERICAL REFERENCES

1 . . . wafer
2 . . . sealed transport container
2a . . . casing
2b . . . main opening
2c . . . opening edge
3 . . . positioning portion
4 . . . lid
5 . . . intake port
6 . . . exhaust port
10 . . . load port apparatus
11 . . . wall
12 . . . installation stand
13 . . . wall-side opening
13a . . . lateral side line part
13b . . . upper side line part
13c . . . lower side line part
14 . . . movable table
16 . . . positioning pin
18 . . . door
20, 120, 220, 320 . . . gas purge unit
22 . . . blowout member
22a . . . tip
22b . . . base portion 22*ba* . . . connection hole
23 . . . elongated hollow
24 . . . discharge portion
27*a*, 27*b*, 27*c*, 27*d*, 27*e* . . . shielding portion
28 . . . supply portion
30 . . . curtain nozzle
40 . . . FFU
50 . . . robot arm
60 . . . EFEM body
60*a* . . . intermediate chamber
70 . . . processing chamber

The invention claimed is:

1. A load port comprising a gas purge unit for introducing a cleaning gas into a container with a main opening therethrough for taking a housed object in and out, a wall opposed to the container and formed a wall-side-opening and a door opening and closing the wall-side opening and the main opening, wherein the gas purge unit comprises:

a blowout member with a cylindrical shape comprising an elongated hollow extending in a longitudinal direction and a discharge portion of a porous body connecting between the elongated hollow and the outside to discharge the cleaning gas through the porous body, a supply portion connected to the elongated hollow through a connection hole formed at one end of the blowout member to supply the cleaning gas to the elongated hollow, and a shielding portion extending in the longitudinal direction of the blowout member and arranged at a part of radial directions perpendicular to the longitudinal direction to shield a cleaning gas flow toward opposite side to the main opening, wherein the shielding portion is attached on an inner surface of the wall opposite to a container side of the wall, wherein the shielding portion has a first part shielding the cleaning gas flow toward opposite side to the main opening along the inner surface of the wall, a second part shielding the cleaning gas flow toward opposite side to the main opening along a perpendicular direction to the inner surface of the wall, a third part shielding the cleaning gas flow toward the main opening along the inner surface of the wall and a fourth part toward the main opening along a perpendicular direction to the inner surface of the wall and forming a gap between the third part.

* * * * *